(12) United States Patent
Shin et al.

(10) Patent No.: US 9,663,349 B2
(45) Date of Patent: May 30, 2017

(54) MEMS DEVICE WITH ELECTRODES PERMEABLE TO OUTGASSING SPECIES

(71) Applicant: InvenSense, Inc., San Jose, CA (US)

(72) Inventors: Jongwoo Shin, Pleasanton, CA (US); Houri Johari-Galle, San Joe, CA (US); Martin Lim, San Mateo, CA (US); Joseph Seeger, Menlo Park, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/935,296

(22) Filed: Nov. 6, 2015

(65) Prior Publication Data

US 2016/0376143 A1  Dec. 29, 2016

Related U.S. Application Data

(60) Provisional application No. 62/183,652, filed on Jun. 23, 2015.

(51) Int. Cl.
*H01L 29/84* (2006.01)
*B81B 3/00* (2006.01)
*B81C 1/00* (2006.01)

(52) U.S. Cl.
CPC ........ *B81B 3/0089* (2013.01); *B81C 1/00206* (2013.01); *B81B 2203/0315* (2013.01); *B81B 2203/04* (2013.01); *B81B 2207/07* (2013.01); *B81C 2201/016* (2013.01); *B81C 2203/035* (2013.01)

(58) Field of Classification Search
CPC ........... H01L 2924/1461; B81B 3/0089; B81B 2203/04; B81B 2207/07; B81C 1/00206; B81C 2201/016
USPC ......................................................... 257/415
See application file for complete search history.

(56) References Cited

U.S. PATENT DOCUMENTS 6,215,644 B1 * 4/2001 Dhuler .................... H01G 5/16
361/280

* cited by examiner

*Primary Examiner* — Elias M Ullah
(74) *Attorney, Agent, or Firm* — Amin, Turocy & Watson, LLP

(57) ABSTRACT

A MEMS device and method for providing a MEMS device are disclosed. In a first aspect, the MEMS device comprises a first substrate and a second substrate coupled to the first substrate forming a sealed enclosure. A moveable structure is located within the sealed enclosure. An outgassing layer is formed on the first or second substrates and within the sealed enclosure. A first conductive layer is disposed between the moveable structure and the outgassing layer, wherein the first conductive layer allows outgassing species to pass therethrough.

19 Claims, 3 Drawing Sheets

MEMS DEVICE WITH ELECTRODES PERMEABLE TO OUTGASSING SPECIES

CROSS-REFERENCE TO RELATED APPLICATION

This application claims benefit under 35 USC 119(e) of U.S. Provisional Patent Application No. 62/183,652, filed on Jun. 23, 2015, entitled "MEMS DEVICE WITH ELECTRODES PERMEABLE TO OUTGASSING FILM," which is incorporated herein by reference in its entirety.

FIELD OF THE INVENTION

The present invention relates to microelectromechanical systems (MEMS) devices, and more particularly, to MEMS devices that include electrodes that are permeable to outgassing species.

BACKGROUND

Microelectromechanical systems (MEMS) devices can have different cavities within the same cap and substrate. The cavities may require different cavity pressures for optimal performance of each device. Conventional integrated 6-axis eutectic wafer bonding processes set identical pressures for varying cavities. Conventional MEMS devices include electrodes that limit the ability to increase the cavity pressures. Therefore, there is a strong need for a solution that overcomes the aforementioned issues. The present invention addresses such a need.

SUMMARY OF THE INVENTION

A MEMS device and method of providing a MEMS device are disclosed. In a first aspect, the MEMS device comprises a first substrate and a second substrate coupled to the first substrate forming a sealed enclosure. A moveable structure is located within the sealed enclosure. An outgassing layer is formed on the first or second substrates and within the sealed enclosure. A first conductive layer is disposed between the moveable structure and the outgassing layer, wherein the first conductive layer allows outgassing species to pass therethrough.

In a second aspect, a method of providing a MEMS device comprises providing a passivation layer on a base substrate, wherein the passivation layer includes a plurality of layers, wherein a top layer of the plurality of layers comprises an outgassing layer, providing at least one conductive via through the passivation layer, providing a metal layer on the outgassing layer, wherein the metal layer is electrically coupled to at least one interconnect metal in the base substrate through the at least one conductive via, wherein the metal layer includes at least one conductive contact layer thereon, wherein the at least one conductive contact layer allows gases from the outgassing layer to pass therethrough, and bonding the base substrate to another substrate, wherein the another substrate includes at least one standoff thereon, wherein the at least one standoff is coupled to the metal layer.

BRIEF DESCRIPTION OF THE DRAWINGS

The accompanying figures illustrate several embodiments of the invention and, together with the description, serve to explain the principles of the invention. One of ordinary skill in the art readily recognizes that the embodiments illustrated in the figures are merely exemplary, and are not intended to limit the scope of the present invention.

DETAILED DESCRIPTION

Figure 1:
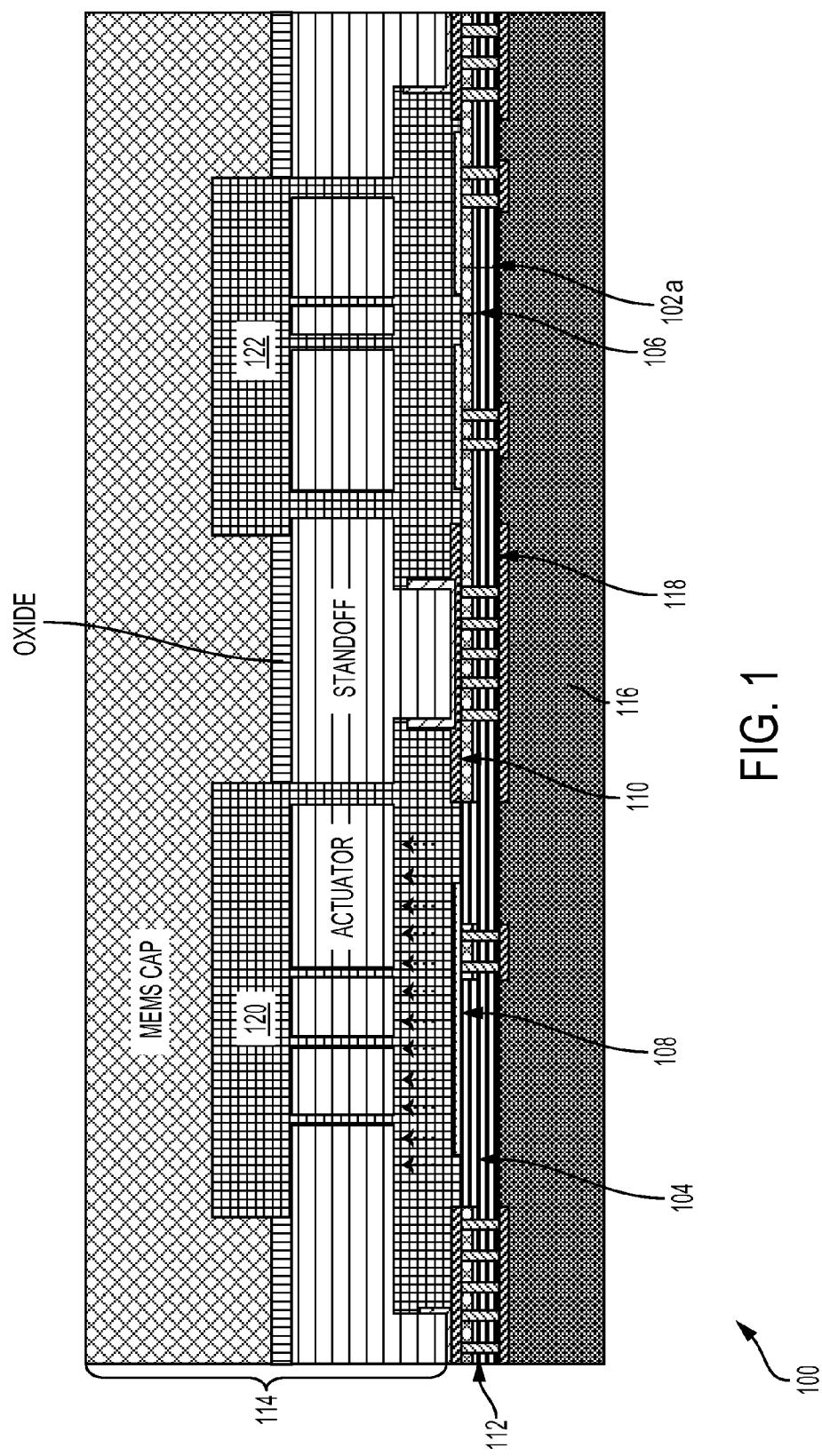
FIG. 1 illustrates a cross-section view of a MEMS device in accordance with an embodiment.

The present invention relates to microelectromechanical systems (MEMS) devices, and more particularly, to MEMS devices that include electrodes that are permeable to outgassing species. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

Micro-Electro-Mechanical Systems (MEMS) refers to a class of devices fabricated using semiconductor-like processes and exhibiting mechanical characteristics such as the ability to move or deform. MEMS often, but not always, interact with electrical signals. A MEMS device may refer to a semiconductor device implemented as a microelectromechanical system. A MEMS device includes mechanical elements and optionally includes electronics for sensing. MEMS devices include but are not limited to gyroscopes, accelerometers, magnetometers, and pressure sensors.

In MEMS devices, a port is an opening through a substrate to expose MEMS structure to the surrounding environment. A chip includes at least one substrate typically formed from a semiconductor material. A single chip may be formed from multiple substrates, wherein the substrates are mechanically bonded to preserve functionality. Multiple chips include at least two substrates, wherein the at least two substrates are electrically connected but do not require mechanical bonding.

Typically, multiple chips are formed by dicing wafers. MEMS wafers are silicon wafers that contain MEMS structures. MEMS structures may refer to any feature that may be part of a larger MEMS device. One or more MEMS features comprising moveable elements is a MEMS structure. MEMS features may refer to elements formed by a MEMS fabrication process such as bump stop, damping hole, via, port, plate, proof mass, standoff, spring, and seal ring.

A MEMS handle layer provides mechanical support for a MEMS device layer. In some embodiments, the handle layer serves as a cap to the MEMS structure. Bonding may refer to methods of attaching and the MEMS substrate and an integrated circuit (IC) substrate may be bonded using a eutectic bond (e.g., AlGe, CuSn, AuSi), fusion bond, compression, thermocompression, adhesive bond (e.g., glue, solder, anodic bonding, glass frit). An IC substrate may refer to a silicon substrate with electrical circuits, typically CMOS circuits. A package provides electrical connection between bond pads on the chip to a metal lead that can be soldered to a printed board circuit (PCB). A package typically comprises a substrate and a cover.

MEMS devices that include both accelerometers and gyroscopes may require different cavity pressures for optimal performance of each device (i.e., one cavity pressure for the accelerometer and another cavity pressure for the gyroscope). Current integrated 6-axis processes include eutectic wafer bonding that set identical pressures for the accelerometer and gyroscope cavities. In order to increase the accelerometer cavity pressure, a method and system in accordance with the present invention provides for an outgassing material or film to be laid down or deposited in certain areas of the accelerometer cavity to increase the pressure of the accelerometer cavity. The method and system can be utilized with any 6-axis, 7-axis, and 9-axis products that have both gyroscope and other sensors (e.g., accelerometers, magnetometers, barometers, etc) integrated and where differentiated cavity pressures are desired.

In addition, the outgassing material or firm can be laid down or deposited within the inside of the entire accelerometer cavity area and even under the electrodes to maximize the area of the outgassing film and cavity pressure increasing capabilities. To enable the outgassing material to be placed even under the electrodes, the method and system in accordance with the present invention utilizes a thin or porous material for the electrode material.

In one embodiment, the thickness of the electrode material is between 50 and 100 nanometers (nm). In another embodiment, the thickness of the electrode material is even lower than 50 nm or higher than 100 nm. In one embodiment, the electrode material is made from any of titanium nitride (TiN), tantalum nitride (TaN), a combination thereof, and any material that posses similar properties to TiN and TaN.

By providing an electrode material for the electrodes that is thin, porous, patterned, made from a certain material, and/or a combination thereof, the outgassing species (such as hydrogen) of the outgassing layer that is layered beneath the electrodes can permeate through the electrodes and increase the cavity pressure. In another embodiment, the electrode material is porous and conductive in addition to being thin and being made from a certain type of material. In another embodiment, the electrode material is patterned with holes which also enables the outgassing from the outgassing layer to be maximized. The pattern of holes can includes a variety of different patterns and numbers and sizes of holes.

In one embodiment, the cavities within the MEMS device can be formed using eutectic bonding of the MEMS substrate and the CMOS substrate. The cavities include the outgassing layer comprising an outgassing material and the MEMS device can be formed over electrodes inside the cavities. For example, an actuator MEMS device can be formed within the cavity and situated above the electrodes and the outgassing material that is beneath the electrodes.

The electrode and the outgassing material may both be formed on the CMOS substrate. The electrodes are connected to an under layer metal and cover portions of the outgassing material. The electrodes can be patterned to allow the outgassing species to pass through, can be thin and permeable to the outgassing species, and/or can be porous and permeable to the outgassing species.

A separate cavity may be formed by putting separation between the two cavities. An outgassing barrier can be applied over portions of the outgassing material (and only limited to a specific cavity or plurality of cavities) to achieve two different pressures in two separate cavities. The outgassing can be activated by applying any of heat and a laser light during or after the formation of the sealed cavity but the presence of the outgassing barrier will limit the cavity pressure increases from the outgassing.

For example, a first of the two cavities can have very little or no outgassing barrier so that the outgassing can permeate through the permeable electrode and increase the first cavity pressure while the second of the two cavities can completely cover the outgassing material with an outgassing barrier (or have most of it covered) so that the outgassing is blocked which stabilizes the second cavity pressure resulting in the first cavity pressure being higher than the second. Therefore, in a single cavity, the outgassing barrier can be used to control the pressure of the cavity and create differing pressure level between cavities. In one embodiment, the outgassing barrier is made from any of silicon nitride (SiN), silicon rich oxide (SRO), and any thick metal layer that is not permeable to outgassing species.

To describe the features of the present invention in more detail, refer now to the following description in conjunction with the accompanying Figures.

FIG. 1 illustrates a cross-section view of a MEMS device 100 in accordance with an embodiment. The MEMS device 100 includes a MEMS substrate 114 and a CMOS substrate 116 coupled together to form a first cavity 120 and a second cavity 122. The MEMS substrate 114 includes a MEMS cap and at least one actuator and at least one standoff that are each bonded to the MEMS cap via an oxide layer. The CMOS substrate 116 includes a passivation layer 102a that can comprise both an outgassing layer 104 and an outgassing barrier layer 106.

In FIG. 1, at least one electrode 108 is coupled to the outgassing layer 104. In one embodiment, the at least one electrode 108 is directly coupled to the outgassing layer 104 and in another embodiment, it is coupled to the outgassing layer 104 via an outgassing barrier layer 106. The at least one electrode 108 is thin and permeable to outgassing species thereby enabling the outgassing layer to increase the cavity pressure of the first cavity 120.

The MEMS device 100 further includes at least one interconnect conductive via 112 that electrically connects the bond metal 110 to the interconnect metal 118 within the CMOS substrate 116. In one embodiment, the at least one interconnect conductive via 112 is located under the bond metal 110 of the MEMS device and is also located below the at least one electrode 108. The bond metal 110 is coupled to the standoff of the MEMS substrate 114 thereby coupling the CMOS substrate 116 to the MEMS substrate 114.

As seen in FIG. 1, the right side of the cross-section view illustrates the passivation layer 102a under the second cavity 122. The passivation layer 102a includes both an outgassing layer 104 and an outgassing barrier layer 106. The outgassing barrier layer 106 does not enable the outgassing species to enter the second cavity 122 which thereby limits any increases to the cavity pressure of the second cavity 122.

However, the left side of the cross-section view illustrates a passivation layer under the first cavity 120 but this passivation layer has portions that do not include the outgassing barrier layer 106. Thus, the outgassing layer 104 is directly coupled to the at least one electrode 108 that is thin and permeable and allows gases to pass therethrough. As a result of the at least one electrode 108 that is thin and permeable and of the portions of the passivation layer that do not include an outgassing barrier layer 106, the outgassing species will pass through the at least one electrode 108 thereby increasing the pressure within the first cavity 120 whereas the pressure within the second cavity 122 will stay relatively the same.

Figure 2:
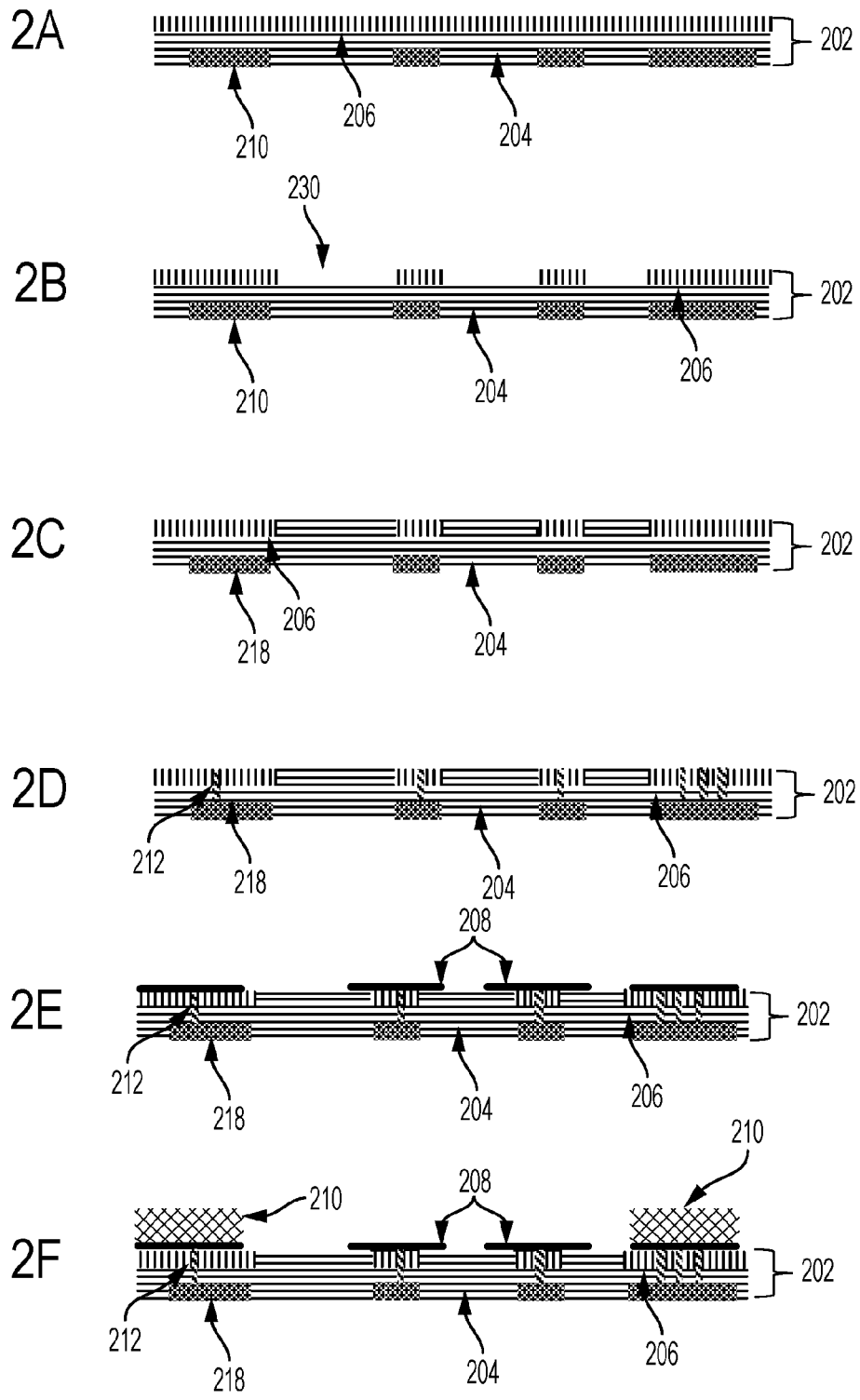
FIG. 2 illustrates a method of providing a permeable electrode for outgassing of a MEMS device in accordance with an embodiment.

FIG. 2 illustrates a method 200 of providing a permeable electrode for outgassing of a MEMS device in accordance with an embodiment. The method 200 includes providing a passivation layer 202 over a CMOS substrate of the MEMS device, via step 2A. The passivation layer 202 includes both an outgassing material/layer 204 and an outgassing barrier layer 206. The outgassing material 204, when heated, releases outgassing species or gases that increase the cavity pressure of the sealed MEMS cavity. At least one interconnect metal 210 is located within a bottom portion of the passivation layer 202. The passivation layer 202 is patterned using an etching process (or another similar process) to remove portions of the outgassing barrier layer 206 which results in at least one gap 230 absent of outgassing barrier, via step 2B.

The at least one gap 230 is filled in with additional outgassing material 204, via step 2C, and at least one interconnect via 212 is placed within the passivation layer 202 to connect the top portion of the passivation layer 202 with the interconnect metal 218, via step 2D. A plurality of electrodes 208 are coupled to the top portion of the passivation layer 202 and to the at least one interconnect via 212, via step 2E, and a bond metal 210 is coupled to at least a portion of the plurality of electrodes 208. The at least one interconnect via 212 electrically connects the plurality of electrodes 208 to the interconnect metal 218. The plurality of electrodes 208 are thin, porous, and/or permeable to allow outgassing gases/species to pass therethrough. The bond metal 210 can be any of a eutectic bond metal and a wire bond metal.

Some of the plurality of electrodes 208 are positioned to only come directly in contact with the outgassing barrier layer 206 and others come in direct contact with both the outgassing barrier layer 206 and the underlying outgassing material 204. Therefore, electrodes of the plurality of electrodes 208 that come directly in contact with the outgassing material 204 can be positioned beneath cavities that require pressure increases (so that the outgassing species can permeate through the permeable electrode to increase the cavity pressure) whereas electrodes of the plurality of electrodes 208 that only are in direct contact with the outgassing barrier layer 206 can be positioned beneath cavities that do not require pressure increases (because the barrier layer will block the outgassing species from permeating through).

Figure 3:
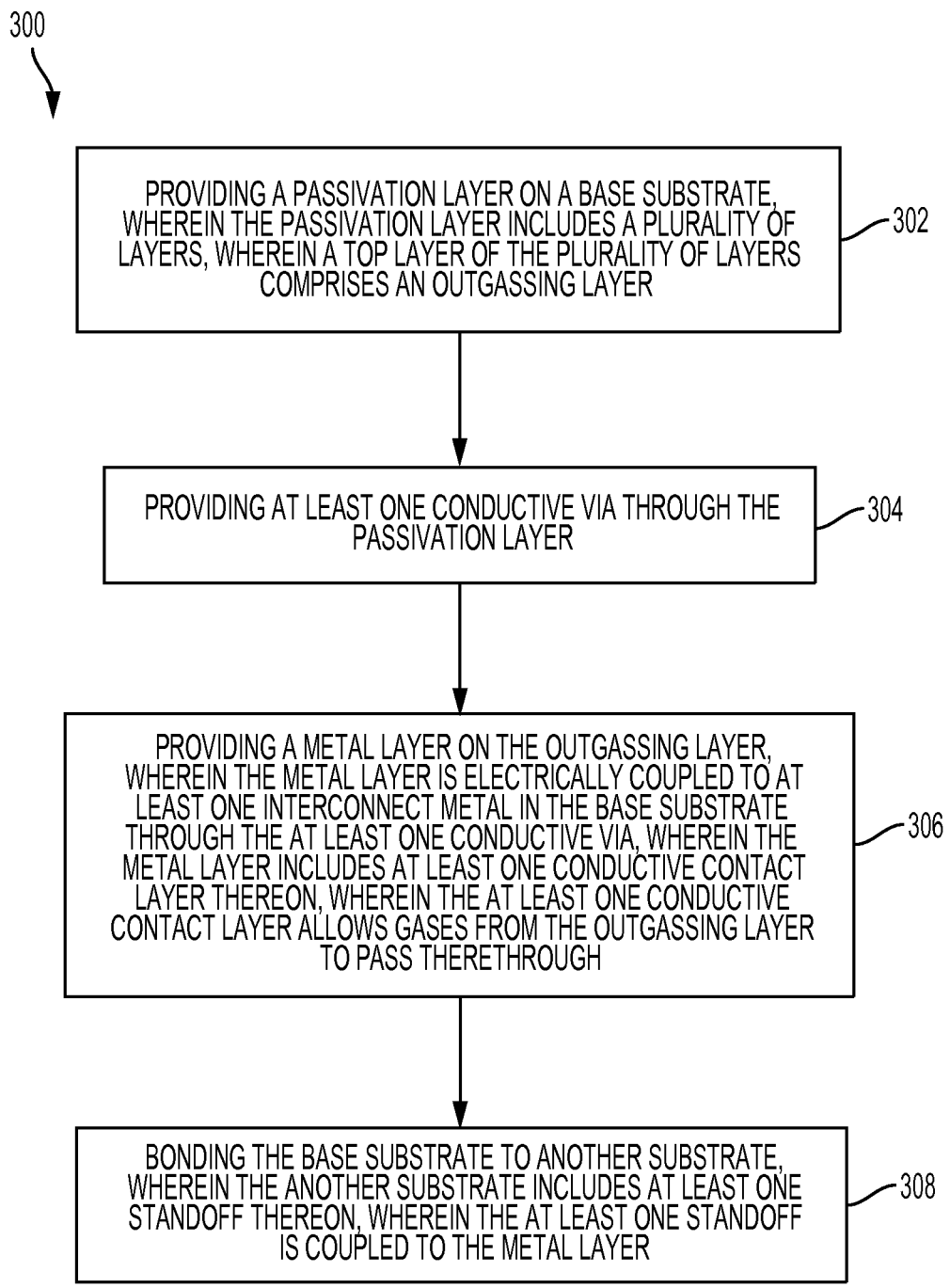
FIG. 3 illustrates a method of providing a MEMS device in accordance with an embodiment.

FIG. 3 illustrates a method 300 of providing a MEMS device in accordance with an embodiment. The method 300 comprises providing a passivation layer on a base substrate, wherein the passivation layer includes a plurality of layers, wherein a top layer of the plurality of layers comprises an outgassing layer, via step 302, providing at least one conductive via through the passivation layer, via step 304, providing a metal layer on the outgassing layer, wherein the metal layer is electrically coupled to at least one interconnect metal in the base substrate through the at least one conductive via, wherein the metal layer includes at least one conductive contact layer thereon, wherein the at least one conductive contact layer allows gases from the outgassing layer to pass therethrough, via step 306, and bonding the base substrate to another substrate, wherein the another substrate includes at least one standoff thereon, wherein the at least one standoff is coupled to the metal layer, via step 308.

A MEMS device and a method of providing the MEMS device are disclosed. In one embodiment, the MEMS device comprises a first substrate and a second substrate coupled to the first substrate forming a sealed enclosure that includes a moveable structure within the sealed enclosure. An outgassing layer is formed on either the first or the second substrates or both and within the sealed enclosure. A first conductive layer is disposed between the moveable structure and the outgassing layer, wherein the first conductive layer allows outgassing species to pass therethrough.

In one embodiment, the moveable structure comprises a second conductive layer, wherein the first and the second conductive layers form a capacitor. In one embodiment, the first conductive layer is any of patterned, permeable, and porous. In another embodiment, the second conductive layer is also any of patterned, permeable, and porous. In one embodiment, the first conductive layer is utilized for any of sensing motion of the moveable structure, providing electrostatic force to the moveable structure, providing a routing interconnection, and any combination thereof.

In one embodiment, the first conductive layer is connected to a constant voltage. In one embodiment, an outgassing barrier layer covers at least a portion of the outgassing layer. In another embodiment, the outgassing barrier layer covers all of the outgassing layer. In one embodiment, the sealed enclosure further comprises a divider forming more than one sealed enclosure (e.g., a first and a second sealed enclosure).

In one embodiment, a first sealed enclosure has a first portion of the outgassing layer covered by the outgassing barrier layer and has a second portion of the outgassing layer not covered by the outgassing barrier layer which results in smaller outgassing and lower pressure within the first sealed enclosure. In this embodiment, the first portion is larger than the second portion. In another embodiment, the second sealed enclosure has a small portion of the outgassing layer covered by the outgassing barrier layer which results in larger outgassing and higher pressure within the second sealed enclosure.

In one embodiment, the outgassing layer and the outgassing barrier layer belong to passivation layers of an integrated circuit on any of the first substrate, the second substrate, and any combination thereof. In one embodiment, the outgassing layer comprises any of high density plasma (HDP) oxides and interlayer dielectric materials. In one embodiment, the first conductive layer is electrically connected to at least one interconnect metal using at least one conductive via any of through the outgassing layer and through both the outgassing barrier layer and the outgassing layer.

In one embodiment, the outgassing barrier layer comprises any of silicon rich oxide (SRO) and silicon nitride (SiN). In one embodiment, the at least one conductive via comprises any of copper and tungsten. In one embodiment, the first conductive layer comprises any of Titanium Nitride (TiN), Tantalum Nitride (TaN), and Tungsten Nitride (WN). In one embodiment, the thickness of the first conductive layer is less than 1000 angstroms. In one embodiment, the first substrate includes at least one standoff thereon that is coupled to at least one first conductive pad.

In one embodiment, a method of providing a MEMS device comprises providing a passivation layer on a base substrate, wherein the passivation layer includes a plurality of layers, wherein a top layer of the plurality of layers comprises an outgassing layer, providing at least one conductive via through the passivation layer, providing a metal layer on the outgassing layer. In this embodiment, the metal layer is electrically coupled to at least one interconnect metal in the base substrate through the at least one conductive via, wherein the metal layer includes at least one conductive contact layer thereon, wherein the at least one conductive contact layer allows gases from the outgassing layer to pass therethrough.

The method further includes bonding the base substrate to another substrate, wherein the another substrate includes at least one standoff thereon, wherein the at least one standoff is coupled to the metal layer. In another embodiment, the method further comprises depositing a Germanium (Ge) layer on the at least one standoff before the bonding of the base substrate (e.g., CMOS substrate) to the another substrate (e.g., MEMS substrate).

In one embodiment, the at least one conductive contact layer is any of patterned, thin, and porous to allow the gases to pass therethrough and the thickness of the at least one conductive contact layer is less than 1000 angstroms. In one embodiment, the at least one conductive via comprises any of copper and tungsten. In one embodiment, the top layer of the passivation layer is a barrier layer, wherein the outgassing layer is another layer of the plurality of layers and the outgassing layer is coupled under or beneath the barrier layer. In another embodiment, the top layer of the passivation layer includes the barrier layer on top of the outgassing layer.

As above described, a method and system in accordance with the present invention has the advantage of providing a MEMS device with at least one cavity whose pressure can be adjusted using an outgassing material that is deposited within the cavity that has been formed by bonding two substrates (e.g., a MEMS and a CMOS substrate) together. The presence of the outgassing material enables the cavity pressure to be increased. In the method and system in accordance with the present invention, the outgassing material/film is placed inside the entire cavity area of the MEMS device and even under the electrodes thereby maximizing the area of the outgassing material/film and providing greater cavity pressure increasing capabilities.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A MEMS device comprising:
   a first substrate;
   a second substrate coupled to the first substrate forming a sealed enclosure;
   a moveable structure within the sealed enclosure;
   an outgassing layer formed on the first or second substrates and within the sealed enclosure; and
   a first conductive layer disposed between the moveable structure and the outgassing layer, wherein the first conductive layer allows outgassing species to pass through.

2. The MEMS device of claim 1, wherein the moveable structure comprises a second conductive layer, and wherein the first and second conductive layers form a capacitor.

3. The MEMS device of claim 1, wherein the first conductive layer is at least one of patterned, permeable or porous.

4. The MEMS device of claim 1, wherein the first conductive layer is adapted to facilitate sensing motion of the moveable structure.

5. The MEMS device of claim 1, wherein the first conductive layer is adapted to facilitate providing electrostatic force to the moveable structure.

6. The MEMS device of claim 1, wherein the first conductive layer is coupled to a constant voltage.

7. The MEMS device of claim 1, wherein the first conductive layer is adapted to facilitate providing a routing interconnection.

8. The MEMS device of claim 1, wherein an outgassing barrier layer covers at least a portion of the outgassing layer.

9. The MEMS device of claim 8, wherein the sealed enclosure further comprises a divider forming a plurality of sealed enclosures.

10. The MEMS device of claim 9, wherein a first sealed enclosure of the plurality of sealed enclosures has a first portion of the outgassing layer covered by the outgassing barrier layer and has a second portion of the outgassing layer that fails to be covered by the outgassing barrier layer resulting in lower pressure within the first sealed enclosure, and wherein the first portion is larger than the second portion.

11. The MEMS device of claim 8, wherein a second sealed enclosure of the plurality of sealed enclosures has a first portion of the outgassing layer covered by the outgassing barrier layer resulting in larger outgassing and higher pressure within the second sealed enclosure.

12. The MEMS device of claim 8, where the outgassing layer and the outgassing barrier layer are passivation layers of an integrated circuit on at least one of the first or the second substrates.

13. The MEMS device of claim 8, wherein the first conductive layer is electrically connected to at least one interconnect metal using at least one conductive via at least one of through the outgassing layer or through both the outgassing barrier layer and the outgassing layer.

14. The MEMS device of claim 13, wherein the at least one conductive via comprises at least one of copper or tungsten.

15. The MEMS device of claim 8, wherein the outgassing barrier layer comprises at least one of silicon rich oxide (SRO) or silicon nitride (SiN).

16. The MEMS device of claim 1, wherein the outgassing layer comprises at least one of high density plasma (HDP) oxides or interlayer dielectric materials.

17. The MEMS device of claim 1, wherein the first conductive layer comprises at least one of Titanium Nitride (TiN), Tantalum Nitride (TaN) or Tungsten Nitride (WN).

18. The MEMS device of claim 1, wherein a thickness of the first conductive layer is less than 1000 angstroms.

19. The MEMS device of claim 1, wherein the first substrate comprises at least one standoff on the first substrate and that is coupled to at least one first conductive pad.

* * * * *